United States Patent
Furse et al.

(10) Patent No.: US 9,476,932 B2
(45) Date of Patent: *Oct. 25, 2016

(54) SYSTEMS AND METHODS FOR IMPLEMENTING S/SSTDR MEASUREMENTS

(71) Applicant: University of Utah Research Foundation

(72) Inventors: Cynthia Furse, Salt Lake City, UT (US); Faisal Khan, Kansas City, MO (US)

(73) Assignee: University of Utah Foundation, Salt Lake City, UT (US)

(*) Notice: Subject to any disclaimer, the term of this patent is extended or adjusted under 35 U.S.C. 154(b) by 0 days.

This patent is subject to a terminal disclaimer.

(21) Appl. No.: 15/002,704

(22) Filed: Jan. 21, 2016

(65) Prior Publication Data

US 2016/0169957 A1 Jun. 16, 2016

Related U.S. Application Data

(63) Continuation of application No. 13/842,854, filed on Mar. 15, 2013, now Pat. No. 9,244,117.

(51) Int. Cl.
| | |
|---|---|
| *G01R 31/11* | (2006.01) |
| *G01R 31/28* | (2006.01) |
| *G01R 27/06* | (2006.01) |
| *G01R 27/02* | (2006.01) |

(52) U.S. Cl.
CPC .............. *G01R 31/11* (2013.01); *G01R 27/06* (2013.01); *G01R 31/2841* (2013.01); *G01R 31/2879* (2013.01); *G01R 27/02* (2013.01)

(58) Field of Classification Search
CPC ...... G01R 31/11; G01R 31/40; G01R 31/26; G01R 31/28; G01R 31/08; G01R 31/312; G01R 31/2879; G01R 31/2841; G01R 27/02; G01R 27/06

See application file for complete search history.

(56) References Cited

U.S. PATENT DOCUMENTS

| | | | |
|---|---|---|---|
| 6,868,357 B2 | 3/2005 | Furse | |
| 6,937,944 B2 | 8/2005 | Furse et al. | |
| 7,069,163 B2 | 6/2006 | Gunther et al. | |
| 7,165,200 B2 | 1/2007 | Jani et al. | |
| 7,215,126 B2 | 5/2007 | Furse et al. | |
| 7,250,772 B2 | 7/2007 | Furse et al. | |
| 7,271,596 B2 | 9/2007 | Lo et al. | |
| 7,495,450 B2 | 2/2009 | Furse et al. | |
| 7,548,071 B2 | 6/2009 | Harrison et al. | |
| 7,622,931 B2 | 11/2009 | Wu et al. | |
| 9,244,117 B2 * | 1/2016 | Furse | G01R 31/2841 |

(Continued)

OTHER PUBLICATIONS

Furse, C. et al., "Feasibility of Reflectometry for Nondestructive Evaluation of Prestressed Concrete Anchors," IEEE Journal of Sensors, vol. 9, No. 11, Nov. 2009, pp. 1322-1329.

(Continued)

*Primary Examiner* — Son Le
(74) *Attorney, Agent, or Firm* — Norton Rose Fulbright US LLP

(57) ABSTRACT

Systems and methods which utilize spread spectrum sensing on live circuits to obtain information regarding a circuit under test are provided. In some embodiments S/SSTDR testing may be utilized to obtain R, L, C and Z measurements from circuit components. In yet further embodiments, these measurements may be utilized to monitor the output of sensors on a circuit.

20 Claims, 9 Drawing Sheets

(56) References Cited

U.S. PATENT DOCUMENTS

| | | |
|---|---|---|
| 2006/0061368 A1 | 3/2006 | Furse et al. |
| 2006/0182269 A1 | 8/2006 | Lo et al. |
| 2011/0153235 A1 | 6/2011 | Thomas et al. |
| 2011/0181295 A1 | 7/2011 | Haugen et al. |
| 2011/0227582 A1 | 9/2011 | Ahamed et al. |
| 2011/0313691 A1 | 12/2011 | Dobson et al. |
| 2014/0103937 A1 | 4/2014 | Khan et al. |

OTHER PUBLICATIONS

Chung, Y. et al., "Capacitance and Inductance Sensor Circuits for Detecting the Lengths of Open and Short Circuited Wires," IEEE Tranactions of Instrumentation and Measurement, vol. 58, No. 8, Aug. 2009, pp. 2495-2502.

Lo, C. et al., "Modeling and Simulation of Branched Wiring Networks," Applied Computational Electromagnetics Society (ACES) Journal, vol. 23, No. 2, Jun. 2008, pp. 143-148.

Sharma, C. et al., "Low-Power STDR CMOS Sensor for Locating Faults in Aging Aircraft Wiring," IEEE Sensors Journal, vol. 7, iss. 1, Jan. 2007, pp. 43-50.

Wu, S. et al., "Non-Contact Probes for Wire Fault Location with Reflectometry," IEEE Sensors Journal, vol. 6, iss. 6, Dec. 2006, pp. 1716-1721.

Griffiths, L. et al., "The Invisible Fray: A Critical Analysis of the Use of Reflectometry for Fray Location," IEEE Journal of Sensors, vol. 6, iss. 3, Jun. 2006, pp. 697-670.

Naik, S. et al., "Multicarrier Reflectometry," IEEE Sensors Journal, vol. 6, No. 3, Jun. 2006, pp. 812-818.

Furse, C. et al., "Feasibility of Spread Spectrum Reflectometry for Location of Arcs on Live Wires," IEEE Journal of Sensors, vol. 5, No. 6, Dec. 2005, pp. 1445-1450.

Tsai, P. et al., "Mixed Signal Reflectometer Hardware Implementation for Wire Fault Location," IEEE Sensors Journal, vol. 5, No. 6, Dec. 2005, pp. 1479-1482.

Chung, Y. et al., "Application of Phase Detection Frequency Domain Reflectometry for Locating Faults in an F-18 Flight Control Harness," IEEE Transactions of Electromagnetic Compatibility, vol. 47, No. 2, May 2005, pp. 327-334.

Smith, P. et al., "Analysis of Spread Spectrum Time Domain Reflectometry for Wire Fault Location," IEEE Sensors Journal, vol. 5, No. 6, Dec. 2005, pp. 1649-1478.

Lo, C. et al. "Noise Domain Reflectometry for Wire Fault Location," IEEE Transactions of Electromagnetic Compatibility, vol. 47, No. 1, Feb. 2005, pp. 97-104.

Furse, C., et al., "Spread Spectrum Sensors for Critical Fault Location on Live Wire Networks," Journal of Structural Control and Health Monitoring, vol. 12, 2005, pp. 257-267.

Furse, C., et al., "Frequency Domain Reflectometry for on Board Testing of Aging Aircraft Wiring," IEEE Transactions of Electromagnetic Capability, vol. 45, No. 2, May 2003, pp. 306-315.

Furse, C. et al., "Down to the Wire: The Hidden Hazard of Aging Aircraft Wiring," IEEE Spectrum, vol. 38, No. 2, Feb. 2001, pp. 35-39.

International Search Report and Written Opinion issued for PCT/US2014/028847, dated Aug. 19, 2014; 11 pages.

\* cited by examiner

SYSTEMS AND METHODS FOR IMPLEMENTING S/SSTDR MEASUREMENTS

CROSS-REFERENCE TO RELATED APPLICATIONS

This application is a continuation of U.S. patent application Ser. No. 13/842,854 filed Mar. 15, 2013 and entitled "SYSTEMS AND METHODS FOR IMPLEMENTING S/SSTDR MEASUREMENTS," the disclosure of which is incorporated herein by reference in its entirety.

TECHNICAL FIELD

The present application relates to measuring reflected electrical signals to derive information from the reflected signals.

BACKGROUND

Since the advent of electrical circuits, systems, and electronic devices various methods have been conceived to test these devices in order to recognize flaws in the electronic circuits and to improve design. Common testing methods may include using a separate tool or meter which a user may utilize to make electrical contact with a circuit in order to measure various properties such as voltage (V), current (I), resistance (R), capacitance (C), inductance (L) or impedance (Z). Such measurements may be useful in many circumstances, e.g. in circuit design, for interrogating sensors which provide data in terms of these measurements, etc.

More recently, time domain reflectometry (TDR) has been used to provide a single-point measurement (transmit/receive at same point) for the reflection from the circuit. With TDR, a step or pulse is transmitted into a system, reflects off impedance changes in the system and returns to the original test point, where it is received. This provides the step or pulse response of an electrical system as a function of time. This has been used to measure the properties of a transmission line in order to, for example, find a short circuit. TDR is considered a 'time domain' measurement. It can be converted to the 'frequency domain' using a Fourier transform.

Vector network analyzers (VNA)/network analyzers (NA) measure the frequency domain response (transfer function) of a system. They transmit a series of sine waves of different frequencies into the electrical system, and receive the returning sine waves at the same point (reflection, called $S_{11}$) and often other points as well (transmission, called S-parameters $S_{12}$, $S_{13}$, etc. ... Sij). Most VNAs are two port (meaning they can transmit and receive from/to port 1 or port 2 only). Additional data acquisition control circuitry can be added to make them multi-port devices (more than two ports). However, multi-port VNA devices are prone to noise problems. Because of this, the multiple ports are generally utilized sequentially (i.e. to take one measurement with one port, and then another with the next port, progressing through all of the ports and port combinations sequentially) when conducting circuit parameter measurements. The frequency domain response provided by the VNA can be converted to the time domain response (TDR equivalent) using an inverse Fourier transform.

It is notable that TDR and VNA methods have significant disadvantages associated with their use when testing circuits. For example, these systems are not able to be utilized in a live setting. Because of this, in order to run tests using these tools, one must disconnect the circuit under test from its functioning environment. In many applications, such as power distribution networks that cannot be readily shut down, such a necessity is problematic. Additionally, as testing of a circuit occurs outside of its functioning environment, it is more difficult to find intermittent problems in a circuit, or problems that occur only under load (such as battery degradation). TDR and VNA methods are also expensive due to complications which arise when handling tests at higher bandwidths. For example, TDR requires fast sampling to acquire reflected signals. As such, increasing bandwidth requires more sophisticated internal processing circuitry which can handle the faster speeds. VNA methods require a precise sine wave generator and receiver, which at higher frequencies are more difficult to implement. Furthermore, the noise immunity from and interference with a circuit under test are problematic for TDR and VNA measurements.

Spectral time domain reflectometry (STDR) and spread spectrum time domain reflectometry (S/SSTDR) are two spread spectrum methods that have been applied in more limited circumstances, such as in testing signal paths for locating faults on live aircraft cables, power cables for undersea oil drilling platforms, and the like. However, such methods have not been utilized and/or more fully developed for more in-depth testing of circuit components, e.g. testing R, L, C, and Z in a circuit or system, for utilizing multi-port testing, and the like.

BRIEF SUMMARY

The present application provides for systems and methods which utilize spread spectrum sensing on live circuits to obtain information regarding a circuit under test. In some embodiments S/SSTDR testing may be utilized to obtain R, L, C and Z measurements from circuit components. In yet further embodiments, these measurements may be utilized to monitor the output of sensors that are part of a circuit. Furthermore, S/SSTDR testing may be used for testing of transmission lines that themselves act as distributed sensors, or may have sensors connected to them and one or many points.

In some embodiments methods for multi-port testing with S/SSTDR are provided. More specifically, using S/SSTDR, embodiments may test simultaneously at multiple locations using multiple test signals while compensating for interference and bandwidth restrictions. Such multi-port testing may decrease the overall time necessary to run tests with respect to prior methods as two or more ports may be active simultaneously to obtain measurements. These methods can also allow simultaneous analysis (as opposed to asynchronous analysis) of the system from multiple test points, which may be useful to test an intermittent fault or function from multiple directions/points.

Some embodiments may also include systems and methods to improve S/SSTDR measurement resolution and accuracy. For example, embodiments may utilize a pseudo noise (PN) code which is transmitted on a transmission line and observe where it reflects off of a connection point and another impedance change at a later distance. The correlation of the original test signal and this reflected signature provides a correlation signature which can be used for further analysis to provide for higher resolution measurements. Embodiments may also utilize curve fitting algorithms, statistical evaluation, matched filters, sliding correlators, etc., which provide more accurate measurement of the S/SSTDR signature, which can in turn be used to find the impedance or step response of the system, and from that, the quantification of the system under test. Embodiments may include longer PN codes or averaging over multiple PN codes to reduce measurement noise and thus enable more accurate processing and detection of smaller impedance changes.

In some embodiments, methods and devices which connect one or more additional test points to a circuit may be provided. For example, in some embodiments, a complex circuit or network may be provided with a plurality of chokes or other known or prescribed impedances which will provide reference signals reflected to a SSTDR transmission source. These chokes or known impedances may be static or time varying. With these reference signals, embodiments may allow for the monitoring of effects on these references to analyze circuits, locate problems in a circuit, etc.

In some embodiments circuit modeling techniques may be implemented to obtain improvements in testing results. For example, embodiments may utilize frequency dependent modeling to group circuit components into functional blocks for analysis. Such functional blocks may be monitored in order to predict behavior and/or failure likelihood of a circuit under test. In some particular embodiments, this modeling may be implemented in a power converter and utilized to make failure predictions for the power converter. This is method is suitable for large circuits with a great number of components, and this method can find small equivalent pieces that could be analyzed separately—thus makes it possible to analyze the entire circuit.

In some embodiments, SSTDR systems and methods may be utilized to detect arc faults in a PV system where multiple panels are connected through long power distribution lines. Additionally, in some embodiments, SSTDR systems and methods may be utilized to detect ground faults and ground loops for a PV system.

Embodiments may also provide for systems and methods to detect motor and transformer winding faults and/or degradation using SSTDR methods. Such methods may provide models for such devices which may be utilized to analyze these circuits for such faults.

The foregoing has outlined rather broadly the features and technical advantages of the present invention in order that the detailed description that follows may be better understood. Additional features and advantages will be described hereinafter which form the subject of the claims. It should be appreciated by those skilled in the art that the conception and specific embodiment disclosed may be readily utilized as a basis for modifying or designing other structures for carrying out the same purposes of the present application. It should also be realized by those skilled in the art that such equivalent constructions do not depart from the spirit and scope of the application as set forth in the appended claims. The novel features which are believed to be characteristic of embodiments described herein, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present embodiments.

BRIEF DESCRIPTION OF THE DRAWINGS

For a more complete understanding, reference is now made to the following descriptions taken in conjunction with the accompanying drawings, in which.

DETAILED DESCRIPTION

Applications of S/SSTDR Measurements

Figure 1:
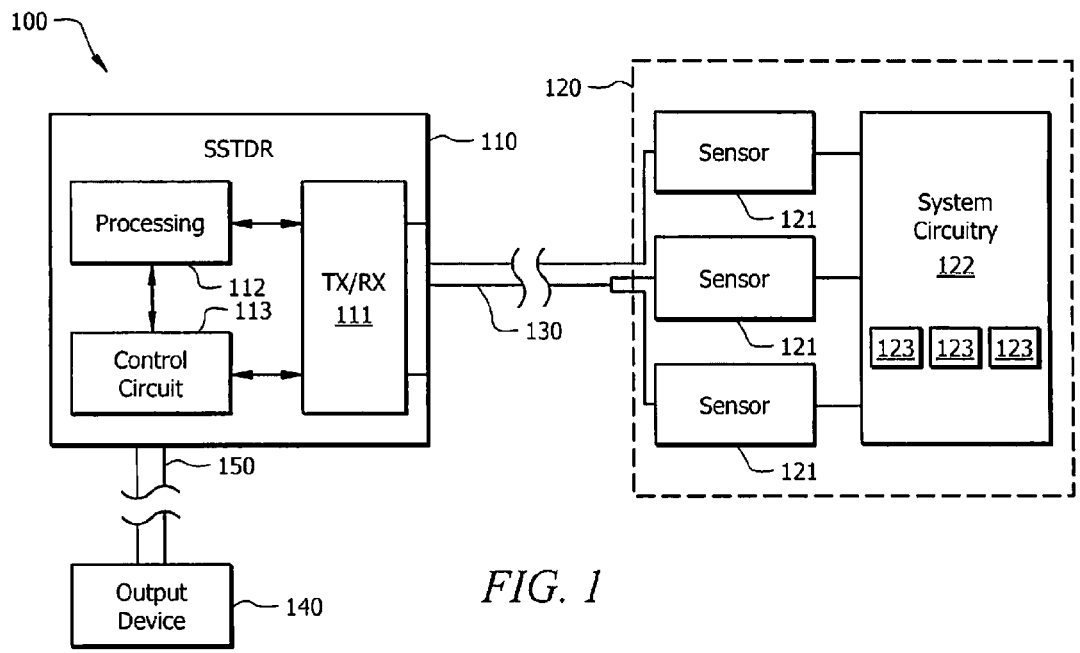
FIG. 1 illustrates an SSTDR testing system in accordance with an embodiment of the present application.

Spread spectrum sensing is different than electrical test systems used today. In general, spread spectrum sensing methods send a coded high frequency electrical signal down a wire, where it reflects off of impedance changes and returns to the original source. The time delay between the incident and reflected signals tells the distance to the fault (its location). The nature of the reflected signal tells what kind of fault it is. For example, the reflected signal is positive for Open Circuit (OC), and negative for short circuit (SC). Previous systems are generally limited or directed toward taking such measurements.

Embodiments may utilize similar principles to detect other variations that may be reflected in the coded electrical signal. Such variations may correspond to resistance (R), inductance (L), capacitance (C), and impedance (Z). In practice, variations due to resistance reflect the incident signal with a magnitude proportional to the reflection coefficient (reflection coefficient=(resistance−characteristic impedance of wire)/(resistance+characteristic impedance of wire)). Variations due to inductance also cause reflected signals at the location of the inductance. These reflections are characterized by high reflection of the high frequency portion of the signal and low reflection of the low frequency portion. This gives the reflected signal a characteristic curve for the inductor. Variations due to capacitance also cause reflected signals at the location of the capacitance. These reflections are characterized by low reflection of the high frequency portion of the signal and high reflection of the low frequency portion. This gives the reflected signal a characteristic curve for the capacitor. Variations due to impedance will cause reflections that are basically a combination of a resistive reflection and a capacitive or inductive reflection simultaneously. They also provide a characteristic curve for the inductor. These characteristic curves are the convolution of the S/SSTDR signature with the impulse response of resistors, inductors, capacitors, and complex impedance. For example, the impulse response of a resistor is an impulse whose magnitude is related to the difference between the resistance and characteristic impedance of the transmission line to which it is attached. The impulse response of an inductor is a (positive) sharp impulse followed by an exponential decay. The impulse response of a capacitor is an exponential rise.

Utilizing a spread spectrum signal to observe such circuit properties provides unique advantages in that it can be transmitted with very low power on top of (summed with) existing live signals in a highly noisy environment without interfering with the existing signals such as pulse width modulated waveforms with high voltage and current magnitudes, and without them interfering with the test signal. The spread spectrum signal may be transmitted below (buried within) the noise margin of the system, so that it does not interfere with DC, AC, or data signals of virtually any magnitude. Yet this signal can be pulled out of that noisy environment using its unique correlation properties that make it highly immune to noise either from the circuit or from the SSTDR circuitry itself. Other advantages may be seen in that low-power measurement methods may be utilized, etc.

FIG. 1 illustrates an S/SSTDR testing system 100 in accordance with an embodiment of the present application. Testing system 100 includes S/SSTDR circuitry 110 and test circuit 120 which are connected across connection 130. Testing system 100 may also include output device 140 which is connected to SSTDR circuitry 110 across connection 150. Testing system 100 is configured to monitor changes in test circuit 120 in order to analyze data propagating from test circuit 120. Such data may correspond to R, L, C, Z measurements coming from, for example, one or more sensors 121 which are configured to sense specific properties of circuit 120. Such sensors may be distributed throughout test circuit 121 or may be located near each other depending on the type of circuit being tested. Additionally, such data may result from properties of individual components 123 within system circuitry 122.

S/SSTDR circuitry 110 includes transmit/receive circuitry 111, signal processing circuitry 112, and control circuitry 113. Transmit/receive circuitry 111 is configured to send a test signal across connection 130 into test component 120 and receive reflections of the test signal back at S/SSTDR circuitry 110. In some embodiments, the test signal will comprise a sine wave signal in the 1-100 MHz range, however, different ranges may be utilized based on the specific application, e.g. when shorter or longer wavelengths will provide for improved data acquisition. The power level of such a signal may be selected based on various circuit parameters. It is noted that in some embodiments a tradeoff may occur in that a higher power test signal may provide for better resolution of a reflected signal, however, if the power of the test signal is too high the signal may interfere with the functionality of test component 110. In some embodiments, the test signal is sent to test component 120 which is configured to propagate within the noise floor of operational signals which are present in component 120 during the normal functionality of the component.

In some embodiments transmit/receive circuitry 111 may be divided into separate portions within S/SSTDR circuitry 110. Such a division may be useful to allow for better data acquisition, e.g., by reducing the amount of noise or interference received at a receiving portion of receiving circuitry 111. Such a separation may also be useful if continuous operation is desired. Further, some embodiments may have a plurality of transmit/receive circuitry portions which are configured to monitor a plurality of separate components. Alternatively, a single S/SSTDR circuit 110 may be configured to monitor multiple test components. In other words, embodiments are not limited to a 1:1 relationship between S/SSTDR circuitry 110 and test component 120.

S/SSTDR circuitry 110 includes signal processing circuitry 112 which is configured to analyze received signal data which has propagated from test component 120 over connection 130. Analyzing received signal data may include analyzing any number of parameters such as power loss, phase shift, frequency shift, etc. Accordingly, any measured property that may be derived from a received signal which is probative of a property of the functionality of test component 120 may be utilized in various embodiments. It is noted that in some embodiments, signal processing circuitry may also be utilized to generate or form the transmission test signals. The results derived from processing circuitry 112 may be output to output device 140 across connection 150.

In some embodiments, processing circuitry 112 may provide raw data for output which may be later processed and analyzed. Moreover, processing circuitry 112 may be utilized to determine/calculate various properties of a circuit component under test such as R, L, C, and Z measurements. Additionally, when such measurements originate from sensor components, such as sensors 121, processing circuitry may associate the R, L, C and Z measurements with the sensing property of the sensor and provide data to output device 140 which indicates a sensed environmental condition. Also, processing circuitry or software may be used to correlate the expected or measured shape of the S/SSTDR reflection to various circuit parameters.

Spread spectrum methods implemented under the control of control circuit 113 and utilizing processing device 112 may be undertaken in multiple ways with respect to sensors 121, for example, systems and methods may: interrogate the sensor to measure its properties, connectivity, location, etc.; determine the magnitude of change or properties of the sensor; determine the location of the change/properties; communicate this information back to a central information hub. Testing can be done either real time (when the system is in use) or dead (during down time), thus enabling early detection and location of latent, intermittent faults.

Sensors may be designed to produce changes in the electrical properties of a component in the presence of a particular environmental stimulus. Example sensors may include:

Resistance Sensors (R):
  Thermister—Measuring temperature.
  Contact/switch—Pressure, touch, weight, etc. can all be used to create various types of contact switches that are open circuit or short circuit, or various resistances, depending on the environment and type of switch.
  Fluid, salinity, chemical, etc.—Many different sensors could be created where the resistance depends on various fluid and chemical compositions.
  Photoresistor—Resistance depends on light.
  Touch/pressure—Some types of touch sensors change resistance with touch or contact.
Capacitance (C):
  Fluid level, fluid type—Many sensors change capacitance with fluid type or height.
  Sound—Microphones change capacitance with voice.
  Touch—Fingerprint sensors and other touch sensors are typically capacitive.
  Proximity sensors—Several types of proximity sensors change capacitance depending on proximity, type of material nearby, etc.
  Batteries—Battery degradation may show up as localized or distributed changes in resistance and/or capacitance, typically under load.
Inductance (L):
  Inductance can be changed by ferromagnetic material inside cores of wound inductors.
Impedance (Z):
  Antennas—Impedance is controlled by antenna type and also by any nearby metallic or conductive objects. Antennas may be used as sensors for moisture, salinity, fluid, etc.
  Combination of R, C or L—Any combination of R and C or L produce an impedance.
Transmission Line (TL):
  Transmission line parameters (velocity or propagation, characteristic impedance, and attenuation) may depend on what it is imbedded in. Fluid height, fluid presence and type, etc. may be measured.
  Traces in a printed circuit board could be considered as transmission lines, and SSTDR could be used to detect degradation or failure.
Voltage Generation: (Some Sensors Produce a Voltage Depending on the Environment)
  Piezo-electric sensors—A type of crystal that produces a voltage when bent, pressed, etc.
  Hall effect—Voltage produced across a gold film with a current across it, when a magnetic field is nearby.
  Solar—Solar panels produce voltage depending on light.

Embodiments may also monitor sensor data and provide such data along with location data of the sensor in a circuit. In this manner, in the event that an environmental change causes a change in electrical properties for one of sensors 121, embodiments, may pinpoint which particular sensor is experiencing the change, thereby allowing for more accurate data for later troubleshooting.

Control circuitry 113 of S/SSTDR circuitry 110 may function to form the test signals, determine timing of when to transmit/receive signals, control signal processing and analysis of received data, etc. Additionally, control circuitry 113 may be configured to control the input and output of data within S/SSTDR device 110. Input data received at SSTDR circuitry 100 may include parameters regarding when, what and how to test a component, etc. Data which is output from S/SSTDR circuitry may include results which are transmitted to an external device, e.g. device 140, for further processing and/or display. While it is not shown in FIG. 1, it is noted that S/SSTDR circuitry 110 may include a display which is integrated within the device and input functionality which allows a user to specify testing parameters.

Connections 130 and 140 may be implemented in any manner sufficient to convey the requisite data transmitted between the respective devices of system 100. Such connections may be implemented in one or more of a wired or wireless connection. Additionally, in some embodiments, connection 130 may be configured to connect to component 120 in a manner where it can utilize existing input/output portions of component 120 without interfering with the functionality of component 120. In other embodiments, component 120 may be provided with dedicated connection points for testing circuitry. In yet another embodiment, S/SSTDR circuitry may be integrated into component 120.

It is noted that component 120 may comprise any type of electronic circuit and/or network of circuits. For example, component 120 may be representative of electronic circuits which are part of vehicles, houses, buildings, and industrial systems, communication and data networks, circuits (including very small VLSI circuits), power distribution and power electronics, batteries and battery systems, lighting and security systems, consumer devices, tools and industrial equipment, farming equipment and electrical systems, control and monitoring systems, antenna and microwave systems, etc. It is notable that such circuits and components may be tested under live conditions in their normal operating environment (e.g. without need of disconnecting from their underlying system, being plugged in to another system, etc.)

In the event that component 120 is a network having multiple points of interconnectivity, it is noted that S/SSTDR can measure and map the electrical integrity of wiring and interconnection systems. Special algorithms are typically needed in order to fully map the network from the multiple reflections that occur from these branched networks due to the complexity of the reflections that may be received. However, to monitor only changes in the network, rather than fully mapping the network, embodiments may use a simpler algorithm. For example, with a measurement before a fault occurs (baseline) and when a fault or other change in condition is present (faulted condition), embodiments may subtract the original baseline from the faulted condition to determine the location of the fault from the subtracted difference. With the location, the component or connection may be isolated and a particular problem may be diagnosed. In some embodiments, this mapping may be utilized with other concepts outlined herein to provide for improved testing results.

Figure 2:
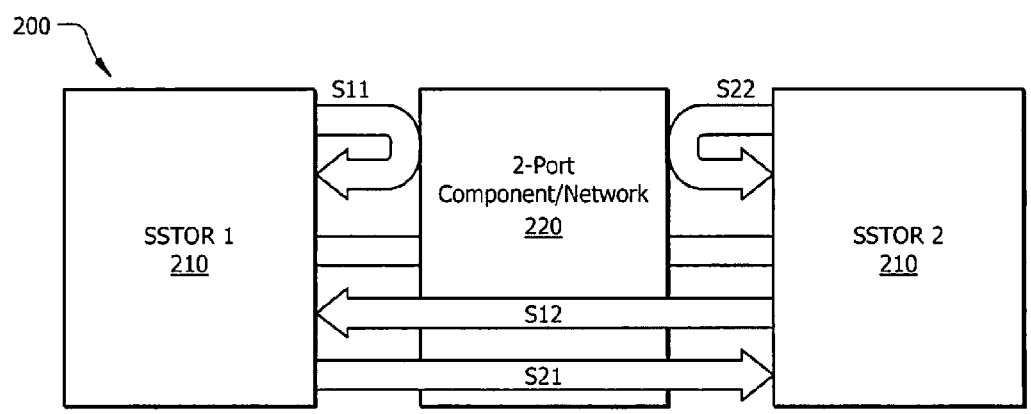
FIG. 2 illustrates a SSTDR testing network in accordance with an embodiment of the present application.

FIG. 2 illustrates a S/SSTDR testing network 200 in accordance with an embodiment of the present application. It is noted that S/SSTDR may be utilized to test anything which TDR or a network analyzer may be used to test. For network analyzer applications in frequency domain, a Fourier transform would be used to convert the SSTDR signature to a frequency domain signature as described in more detail below.

The VNA reflection (typically called $S_{11}$ on the first port or $S_{22}$ on the second port) can be measured with a single SSTDR 210 (1 or 2) connected to the appropriate port of the 2-port network 220 device under test (DUT). These measurements could be made simultaneously, provided two orthogonal (different) PN codes are used to prevent self-interference.

The VNA transmission parameters (typically called $S_{12}$ and $S_{21}$) utilize an S/SSTDR 210 on each port. For this measurement, S/SSTDR1 will transmit its coded signal to S/SSTDR2, which will correlate it with the same code used by S/SSTDR1. S/SSTDR2 will transmit its (different/orthogonal) coded signal to S/SSTDR1, which will correlate it with the code from S/SSTDR2. This can be done simultaneously (if the codes are orthogonal) or sequentially (if they are not). For this measurement, the two S/SSTDRs will typically need to be synchronized. This could typically be done by wiring them together. Alternatively, synchronization methods used for wireless communication could be applied. These could include transmitting a synchronization sequence prior to testing, or using a synchronized reference master clock such as a GPS clock.

Although the VNA concept can be applied in any frequency band, the commercial application of these devices typically emphasizes broad band, high frequency measurements. To cover the same frequency bands as the VNA, the S/SSTDR units would also have to have similar bandwidth coverage. This bandwidth can be enhanced/controlled according to the section discussing improving the S/SSTDR resolution described below.

There are several applications where tests are made from multiple ports on a circuit or network. In general, a VNA is switched from port to port using a data acquisition (DAQ) system to obtain the multi-port S-parameter measurement. Tests for each port are done sequentially. The time to complete testing is the time per individual test times the number of tests (ports). If many ports are tested, this can take a long time, which can be a problem. The VNA is typically too expensive to feasibly be replicated on every port, whereas spread spectrum sensors are in general less expensive and therefore could feasibly be replicated at each port.

There are multiple cases where a device with multiple ports may be tested and/or data may be gathered from multiple ports. For example, testing computer chips would typically require multiple ports to test, as these chips generally have multiple inputs and outputs. S/SSTDR multi-port analysis may be implemented on any circuit components, within antenna arrays, for imaging applications, and the like, where multiple ports are present or could be present to improve performance.

One example embodiment may be seen in medical microwave imaging. One such use may be to image a breast to screen for breast cancer. In this example, arrays of antennas may be disposed surrounding the breast to transmit/receive signals and combine them using imaging algorithms. Since a single VNA is currently used for these tests, the test is done sequentially and takes (at present) about 30 minutes per breast to complete the scans which ends up distorting results due to patient movement and other practical concerns.

For applications requiring tests at multiple ports, particularly those that are time-sensitive, spread spectrum sensors could be feasibly be placed on all ports (e.g. two or more ports) to do the tests simultaneously rather than sequentially. One consideration when accounting for multiple ports is that additional bandwidth may be needed to utilize orthogonal PN codes on each port in order to avoid self-interference. Spread spectrum sensors at each port may also need to be synchronized (e.g. either in time or spatially) to allow for accurate transmission of data. It is noted that speeding up acquisition time may allow for improved time-resolution in many imaging applications. Such improvements may allow various motion or other changing objects within a subject to be imaged.

In some embodiments, individual elements of a circuit or system may be evaluated individually with the overall system. It is appreciated that circuits and systems are combinations of R, L, C and Z elements (and possibly also delay elements—transmission lines) in series, parallel, and potentially in networks. There are numerous applications for testing an individual element for diagnosis and possibly prognosis purposes. Embodiments which evaluate individual elements may use a de-embedding algorithm to isolate the element. Some example algorithms are provided below.

Time Domain Approach

One algorithm would be to use a time domain network approach. This method works as follows:

(1) Measure the time domain signature of the network tdr(t);

(2) Compute the impulse response of the time domain signal p(t). First, find the Fourier transform of the tdr signal (TDR(F)). Divide it by the Fourier transform (F) of the incident TDR signal (TDR_incident(F)). This gives you the frequency domain impulse response P(F). Take the inverse Fourier transform to get back to p(t). Mathematically this is expressed: $p(t)=F^{-1}\{F\{tdr(t)\}/F\{tdr\_incident(t)\}\}$;

(3) Find the zero peak in p(t) (the peak due to connection to the system). For example, if time is at time t0, this corresponds to the reflection where your (known) transmission line connecting the TDR to the system is under test. Find the characteristic impedance of the first section of transmission line in this system using the reflection coefficient Γ(d1). The reflection coefficient is found from the height of the reflected peak ($V_{reflected}$) divided by the height of the incident peak ($V_{incident}$). The characteristic impedance of the first transmission line $Z_o$ can be calculated from the reflection coefficient (solve for $Z_o$ where $Z_o$ testline is the characteristic impedance of the transmission line connecting the TDR to the system under test:

$$\Gamma(\text{at } t_o) = \frac{V_{reflected}}{V_{incident}} = \frac{Z_o - Z_{o\ testline}}{Z_o + Z_{o\ testline}};$$

(4) The length of this first transmission line is found by looking for the first peak in p(t) at t1. This is the time delay to the first element in the network. This corresponds to a transmission length of d1=VOP/t1; and (5) Find the impedance that is causing the first reflection. The reflection coefficient Γ(d1) is found from the height of the reflected peak ($V_{reflected}$) divided by the height of the incident peak ($V_{incident}$). Information from this step may be used as follows:

(a) If the peak is an impulse (shaped like an impulse), the load $Z_L$ at that point is resistive (R) and can be calculated from the reflection coefficient (solve for $Z_L$ where $Z_o$ is the characteristic impedance of the transmission line found in step 3.

(b) If the peak is not an impulse, but is instead shaped like a capacitive or inductive response, curve fit to this response to find the value of capacitance or inductance. If neither of these fits well, fit to complex impedance Z instead. This should take care of all possible combinations of RLC.

(c) Branches—If the geometry of the system is known, the effect of reflection at the branch network can be computed and included (also calculated from the reflection coefficient above).

(d) If the geometry of the system is not known, for each peak, all possible choices for load at that point may be computed. Proceed with step e, computing the later network components independently assuming each of these choices. Eventually, the later network response will eliminate the incorrect choices.
   (e) Once you know the load from the first reflection, compute the expected time domain response from this load, subtract it from the measured response, and repeat steps 5a-d until the circuit or system is fully resolved.

Frequency Dependent Model for DC-DC Converter

Figure 3A:
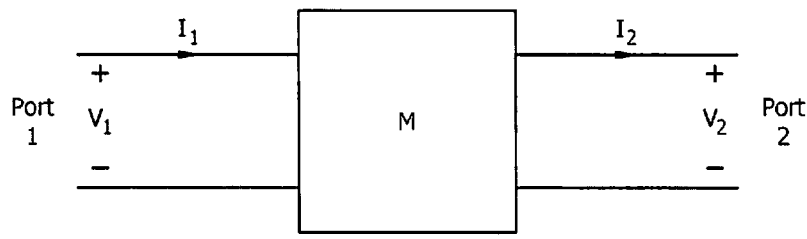
FIG. 3(a) illustrates a two-port network analysis model where M is the ABCD matrix.
Figure 3B:
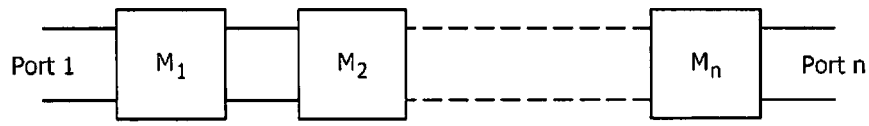
FIG. 3(b) illustrates ABCD matrices that can be multiplied to evaluate sequential electronic components.

Microwave engineering provides us with a very good network analysis modeling tool for complex networks. FIG. 3(a) illustrates a two-port network analysis model where M is the ABCD matrix, and FIG. 3(b) illustrates ABCD matrices that can be multiplied to evaluate sequential electronic components. ABCD matrices ($M_i$) can be defined for either series or parallel elements of all kinds (inductors, capacitors, diodes, etc.). Accordingly, this method can be highly generalized to our application.

The voltages and currents in this model can be related several ways including S, T, Y, and ABCD parameters. ABCD matrices, which relate the voltages and currents as given in equations (1) and (2), are particularly useful for our application.

$$V1 = AV2 - BI2 \quad (1)$$

$$I1 = CV2 - DI2 \quad (2)$$

The ABCD parameters are tabulated for various series and parallel complex impedances (suitable for capacitors, resistors, etc.), diodes, transmission lines, etc. Once the ABCD matrix is found for each individual (simple) element, they can be evaluated sequentially as shown in FIG. 3(b). In systems that have branches, a slightly more complex approach may be utilized. In that case, there are more than two ports, and the ABCD matrices must be built into a larger matrix that links the voltages and the currents in the more complex network. ABCD matrices can also be converted algebraically to S-parameter matrices, which describe the reflection and transmission of voltages at the two ports. S11 is equivalent to the reflection coefficient we seek (equation 1). Both the S and ABCD approaches fully capture the frequency-dependent complex impedances (magnitude and phase) in the circuit and its elements. The ABCD approach allows for easy computation of connected components, although the S approach better represents the reflections we seek. We will move algebraically between the two approaches as needed for computation (ABCD) and analysis (S).

These methods are both frequency domain approaches, so in order to use them for S/SSTDR analysis, the Fourier transform is used to convert ABCD or S matrices evaluated at multiple frequencies to S/SSTDR time domain analysis or to convert S/SSTDR to the frequency domain for analysis. Either approach can be used, but we have generally done our analysis in the time domain. The time domain allows us to time-gate individual elements of the reflection and localize them to individual components in the electrical system, a characteristic that is an advantage for evaluation devices which are built of multiple individual components.

With the knowledge regarding individual components, larger-scale circuit testing may be implemented. For example, a power converter circuit typically has a small number of core components involved in the actual power conversion process, and these are the failure prone components. Depending on the circuit topology, these components could be located in the circuit board in a close proximity. When a power converter is being operated in closed loop, any aging or characteristic variation in one component will simultaneously affect other components—thereby resulting in secondary or tertiary effects. Obtaining these variations associated to key components such as the switching devices and the capacitors may assist in characterizing secondary or tertiary effects. Therefore, a complete model of a power converter with all these second and third order effects may be provided.

To do this, the variation of reliability function with separate change in $R_{DS}$, capacitance (C) and ESR of the capacitor in a simple Boost converter circuit is analyzed. Variation of reliability function with separate change of MOSFET ON resistance ($R_{DS}$), capacitance (C) and ESR of the capacitor (ESR) in a simple Boost converter circuit may also be analyzed.

Change in MOSFET ON resistance $R_{DS}$

Figure 4A:
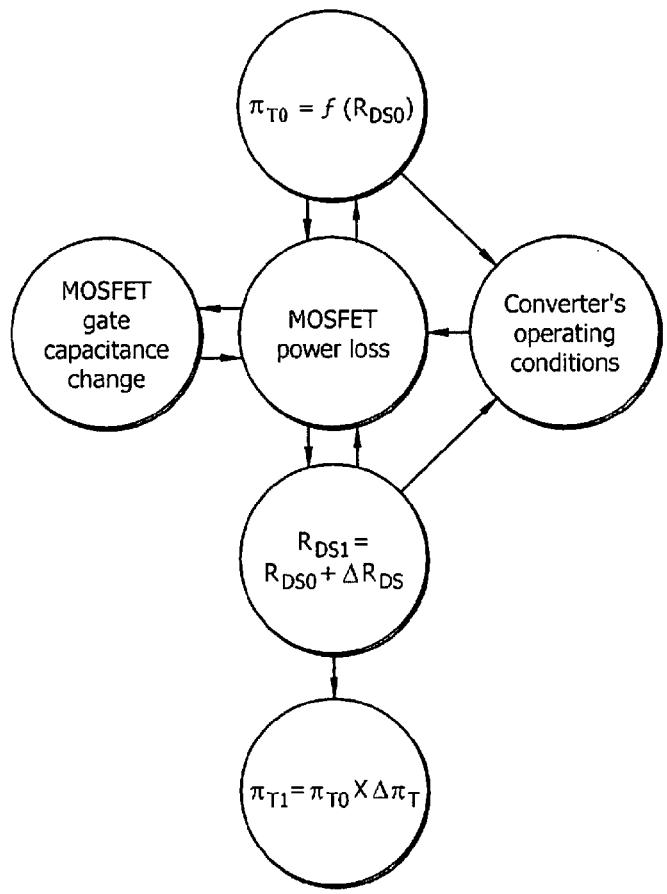
FIG. 4(a) shows the relationship in between variation of $R_{DS}$ as a function of the present value of $R_{DS}$, temperature, and the MOSFET power loss, illustrating that increase in the value of $R_{DS}$ will affect the thermal stress on the switch and the estimated reliability.

An increase in $R_{DS}$ value of a MOSFET is considered as a precursor of MOSFET failure. Variation of $R_{DS}$ is a function of the present value of $R_{DS}$, temperature, and the MOSFET power loss. Any increase in the value of $R_{DS}$ will affect the thermal stress on the switch and the estimated reliability. This is shown in FIG. 4(a).

Therefore, the failure rate of the MOSFET can be written as:

$$\lambda_{sw}(t) = \lambda_{sw0} \times f_1(\Delta R_{DS}) \quad (3)$$

Here, the function $f_1$ is dependent on the change in MOSFET ON resistance, and the change in ON resistance depends on the MOSFET's power loss. In addition, the change in $R_{DS(ON)}$ affects the converter's operating point, and the shift in operating point changes the amount of power loss in MOSFET resulting in a change in the gate capacitance. Therefore, reliability of a switch is highly dependent on the operation of the converter over time and cannot be fully predicted by assuming a constant rate of failure.

Change in Capacitance

Figure 4B:
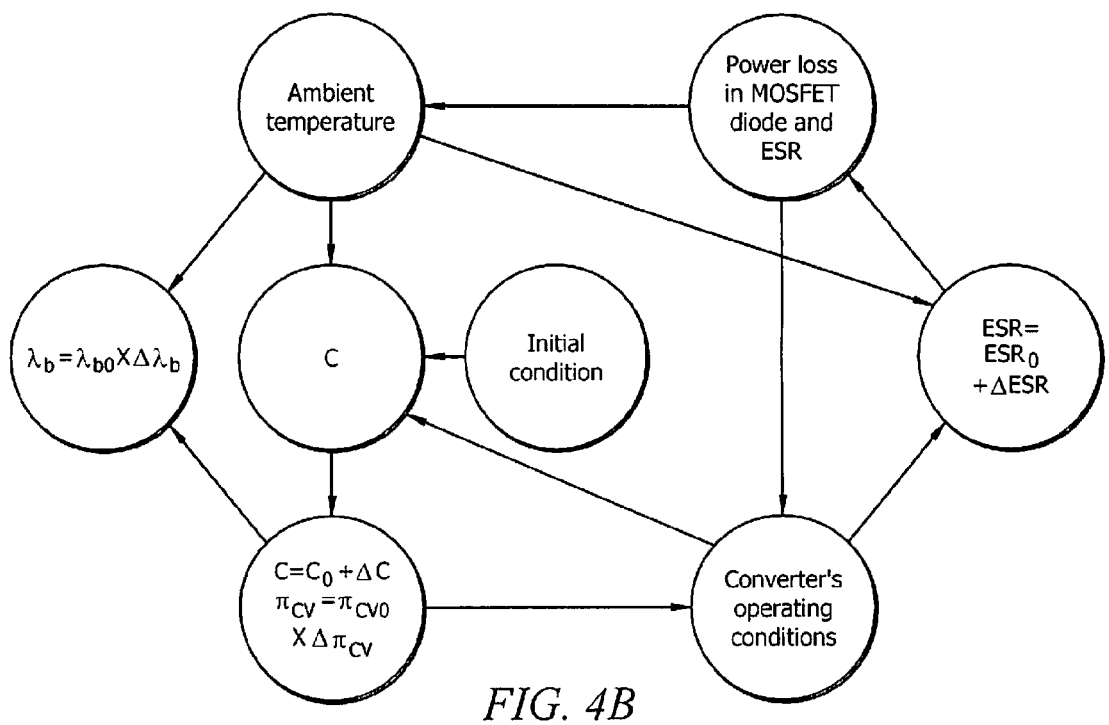
FIG. 4(b) shows the variation in the capacitor value used in the boost converter's operation.

The variation in the capacitor value used in the boost converter's operation is shown in FIG. 4(b). Both the base failure rate and the capacitance have been considered as time varying. These can be written as:

$$\pi_{CV}(t) = \pi_{CV0} \times \Delta \pi_{CV} = \pi_{CV0} \times f_2(\Delta C) \quad (4)$$

$$\lambda_b(t) = \lambda_{b0} \times \Delta \lambda_b = \lambda_{b0} \times f_3(\Delta C, T_a, \Delta T_{power\_loss\_in\_MOSFET\_diode\_and\_ESRs}) \quad (5)$$

$$\lambda_{CAP}(t) = \lambda_{CAP0} \times f_2 \times f_3 = \lambda_{CAP0} \times f_4 \quad (6)$$

Gradual change/degradation in capacitance depends on the type of capacitor used. This change is highly dependent on the ambient temperature, and it is the prominent reason of electrolytic capacitor failure. Moreover, power loss in other power components (MOSFET, diode, equivalent resistance of the inductor, ESR of the capacitor itself) increases ambient temperature for the capacitor. The output voltage ripple increases with any decrease in capacitance, and it increases the voltage stress in the capacitor as well. Higher voltage and current stress plays a significant role to increase the ESR, and any increase in ESR results in higher power loss and ambient temperature rise.

Figure 5:
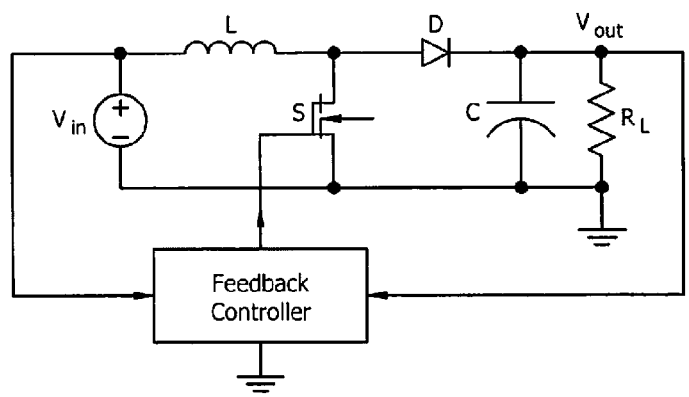
FIG. 5 illustrates a boost converter which may be modeled and/or tested in accordance with the present application.

FIG. 5 illustrates a boost converter which may be modeled in accordance with the present application. Referring to the boost converter shown in FIG. 5, instead of considering the effect of different discrete values of $R_{DS}$, we will consider a time varying change in $R_{DS}$. Therefore, the failure rate of the converter ($\lambda_{SYSTEM}$) will no more be a constant, and the failure rate of the system can be expressed as follows:

$$\lambda_{SYSTEM}(t) = \lambda_{sw}(t) + \lambda_{CAP}(t) + \lambda_{DIODE}(t) \quad (7)$$

The MTTF can be written as:

$$MTTF = \int_0^\infty R_s(t)dt = \int_0^\infty e^{-(\lambda_{SYSTEM}(t) \times t)} dt \neq \frac{1}{\lambda_{SYSTEM}(t)} \quad (8)$$

$$MTTF = \int_0^\infty e^{-(\lambda_{sw}(t) + \lambda_{CAP}(t) + \lambda_{DIODE}(t) \times t)} dt \quad (9)$$

$$= \int_0^\infty e^{-(\lambda_{sw}(t) \times t)} e^{-(\lambda_{CAP}(t) \times t)} e^{-(\lambda_{DIODE}(t) \times t)} dt$$

This approach may be utilized for circuits with a limited number of components, and this is why the reliability analysis of power converters could benefit from this method. An initial reliability of a converter can be estimated based on the measurable quantities such as $R_{DS(ON)}$, ESR, C, etc., and it can be updated periodically by measuring those parameters with a regular interval. In this analysis, the ambient temperature has been considered as a constant.

Figure 6A:
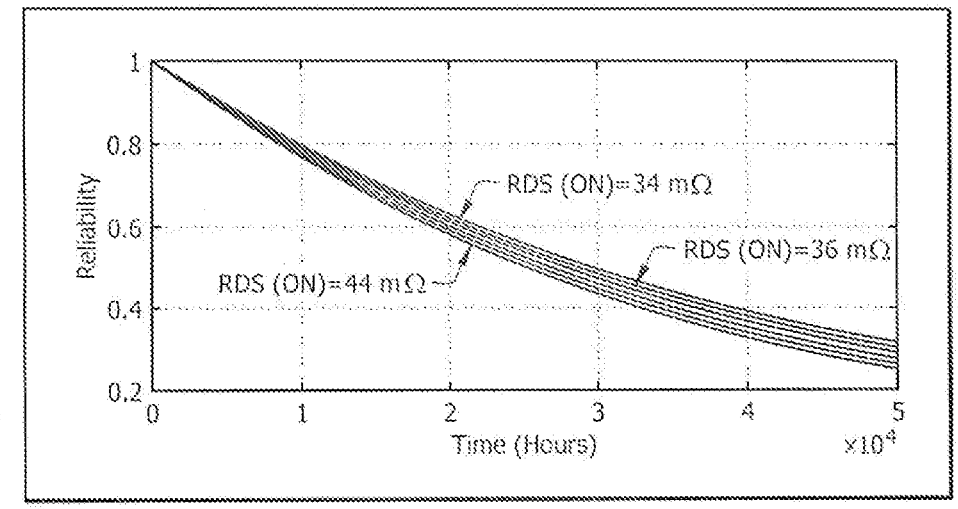
FIG. 6(a) shows calculated system failure rate ($\lambda_{SYSTEM}$) vs. MOSFET $R_{DS(ON)}$ for discrete $R_{DS}$ values.
Figure 6B:
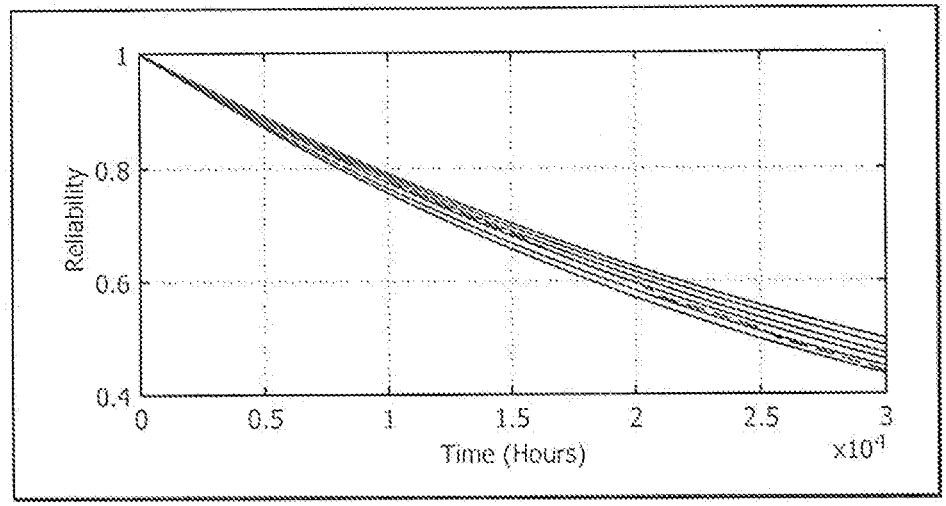
FIG. 6(b) shows plot of calculated system failure rate ($\lambda_{SYSTEM}$) vs. MOSFET $R_{DS(ON)}$ for discrete $R_{DS}$ values assuming a rate of increase in $R_{DS}$ (ON) of 2 mΩ/5000 hours.

It is noted that in this example, only the effect MOSFET $R_{DS}$ change on the reliability/MTTF estimation is considered. Any change in capacitance or change in I/V characteristics of diode are neglected. Calculated system failure rate ($\lambda_{SYSTEM}$) vs. MOSFET $R_{DS(ON)}$ is shown in FIG. 6(a) for discrete $R_{DS}$ values. In reality, $R_{DS}$ will gradually change, and the predicted values shown in FIG. 6(a) will no longer be valid. Assuming a rate of increase in $R_{DS}$(ON) of 2 mΩ/5000 hours, the results have been plotted in FIG. 6(b). Therefore, there is about 4.86% variation in reliability or 5300 hours variation in MTTF if the variation in MOSFET's ON resistance is taken into account. By knowing functions $f_1$, $f_2$, and $f_3$, we can accurately estimate the remaining life of the MOSFETs and the capacitors.

It is noted that the above de-embedding algorithms are shown by way of example. Many algorithms may be used. In general, such algorithms will obtain the impulse response of a circuit and then the response may be evaluated to de-embed the components. Examples of such de-embedding algorithms prognostic methods may also be found in U.S. patent application Ser. No. 13/653,085 which is incorporated by reference herein.

In some embodiments, S/SSTDR systems may be implemented to detect corrosion in a test circuit. Corrosion may be detectable using these methods if it is in a location to affect the transmission of signals down the wire under test. For instance, it can be detected on pins in the connector, but could not be detected on the outer jacket. Corrosion can be measured by comparing a baseline taken before corrosion started to a measurement taken after corrosion occurs. Corrosion will show up as a reflection where there should be none, and that reflection will grow as the condition worsens. This reflection can be evaluated in the time domain, but because corrosion is likely to affect high frequencies more than low frequencies, it could also be worthwhile to evaluate it in the frequency domain as well, concentrating on changes observed at the higher frequencies. Since corrosion is likely to appear as a very small impedance change, it is important to use as much sensitivity as possible. As described in a later section, sensitivity can be increased by using a longer PN code or averaging the same code over a longer time.

As described above, system and methods described herein may be utilized to implement prognostics (e.g. predicting failure) and/or diagnostics (locating problems) on a circuit. In order to implement prognostics, systems and methods may form an aging algorithm which provides reference points and information regarding effects of various components that occur with age. Using these reference points, embodiments may predict the state of health of the circuit under test. Accordingly, in some embodiments, an aging algorithm or model may be formulated using various R, L, C and/or Z, vibration, heat and noise measurements. Changes in such measurements over time may be indicative of circuit aging and possible failure. The disclosed S/SSTDR methods may be utilized to undertake this analysis.

In one embodiment, S/SSTDR circuitry, such as S/SSTDR 110 may be built into an electronic circuit (such as test circuit 120) or chip and allow for built-in testing of the circuit. In this manner, S/SSTDR circuitry may be configured to test backward into the chip and forward into a circuit board connected to the chip. Testing may be implemented during manufacturing, during later use, etc. Further, such a chip may be utilized as a test system to test a circuit which may be later connected to the chip. For example, an S/SSTDR testing system may be embedded in a computer processor. In such an example, the computer may be utilized as a testing device for any circuit which is able to connect to the computer.

In some embodiments, sacrificial elements may be added to a circuit board in order to provide better controls for testing. For example, sacrificial elements (circuit elements, circuit board traces, transmission lines, elements that corrode, etc.) that deteriorate faster than the actual system may be used to the lifespan of the circuit. This deterioration could be slow (such as caused by aging and environmental effects), or it could be fast (such as traces inside a protective coating that break when the coating is compromised). The sacrificial elements can be monitored or tested to observe their failure and thus predict that the system needs repair or is nearing the end of its useable lifespan. In one embodiment, a sacrificial element could be a conductive shield around the wire, an unused pin and socket in a connector, and the like.

Embodiments may also utilize S/SSTDR testing system 100 to monitor variability of a system. It is common among failing systems to see an increase in variability within the system. Intermittent changes in velocity of propagation or impedance can indicate wires that are flopping or vibrating loose, for instance, and this can in turn lead to excess stress and increased risk of failure. Components that start to have more variability with temperature, electrical load, etc. may also be more at risk of failure. Variation can be monitored by making periodic tests of the system over time, and comparing them. When variability increases, this may be a prognostic indicator for some kinds of systems.

Methods of Analysis for S/SSTDR Measurements

The following is a discussion of methods for analyzing received S/SSTDR measurements. This analysis may be implemented by one or more S/SSTDR devices, such as S/SSTDR circuitry 110 210. More specifically, processing resources within such devices may be utilized to control data acquisition and to perform analysis on the received data. It is further noted than in the following embodiments the analysis of the received signals utilizes a PN coded signal, and not the raw signal itself. Using the PN signal provides advantages in that it is naturally noise-immune, can reduce interference with the system or other test signals, and can therefore be used for live testing. The PN code can be implemented with a coded series of square waves, square waves that are sine wave modulated, or with shaped signals.

Using S/SSTDR for R, L, C, Z Evaluation

Electrical signatures for R, L, C, Z are readily understood if the step response or impulse response is known. To obtain the impulse response embodiments may obtain (usually by measurement) the spread spectrum correlation signature. This signature is then converted to the frequency domain using the Fourier transform. Then it may be divided by the Fourier transform of the correlation signature for the spread spectrum input alone. After this, convert the result back to the time domain using the inverse Fourier transform to yield the impulse response. Another method to obtain the impulse response may be to obtain the spread spectrum correlation signature and use a sliding correlator based on the correlation signature for the spread spectrum input alone to yield the impulse response.

To obtain the step response embodiments may obtain (by measurement) the spread spectrum correlation signature. Convert it to the frequency domain using the Fourier transform. Divide it by the Fourier transform of the correlation signature for the spread spectrum input alone, and multiply it by the Fourier transform of the step function. Convert it back to the time domain using the inverse Fourier transform to yield the step function response.

Once the impulse and/or step function response is obtained, many methods are available predict the circuit elements that caused the responses obtained. These include: curve fitting expected curves for specific elements and element combinations to the impulse or step response in either the time or frequency domain; using any linear inversion method including genetic algorithm, Bayesian inversion, or gradient method inversion; and using a matched filter from known elements and element combinations to find the best match to the data in either the time or frequency domain.

Using S/SSTDR for Transmission Line Evaluation

In transmission line evaluation, the correlated spread spectrum signature is obtained. With this signature, the following may be determined:

Distance to a fault/load/component, etc.

Type and magnitude of fault/load/component, etc.

Mapping a wiring and interconnection system (may also include loads and electrical components).

Time and associated nature of changes in fault/load/component, etc.

Wire parameters (characteristic impedance, velocity of propagation, attenuation). These may be used as sensing information for environmental effects such as moisture.

Additional questions about the electrical impedances and their locations within the system.

These parameters may also be associated with environmental parameters of interest (sensors).

Multiple algorithms may be utilized to determine these values, for example, peak detection methods and direct comparison to known theory or simulations may be utilized. Curve fitting on the signature (typically the peaks) may also be utilized to enhance resolution. Embodiments may indicate difference from a known baseline (measured or calculated) and/or utilize optimization and inversion methods including the genetic algorithm, Bayesian algorithms, and gradient methods.

Improving S/SSTDR Resolution

In order to use S/SSTDR for measuring smaller objects, embodiments may provide methods to obtain better resolution in the reflected signals. Embodiments may utilize a PN code which is transmitted on a transmission line and observe where it reflects off of a connection point and another impedance change at a later distance. The correlation of the original test signal and this reflected signature provides a correlation signature which can be used for further analysis to provide for higher resolution measurements. Higher frequency PN codes provide better resolution. Longer PN codes or averaging multiple codes provide better accuracy.

Another method utilizes curve fitting to accurately retrieve the best response. After the S/SSTDR reflection signature is obtained, it can be converted to the impulse response by curve fitting the shape of the expected S/SSTDR correlation to the reflection signature. This can be done with a standard curve fit algorithm, a matched filter, or a sliding correlator, etc. The accuracy of the S/SSTDR reflection signature can be improved by using a longer code or averaging multiple codes. With improved accuracy in the S/SSTDR reflection signature, improved accuracy can also be obtained in the curve fit. Improved accuracy in the curve fit provides improved accuracy in the distance and impedance measurements.

Other methods may be utilized to improve the bandwidth of the system. Such methods may include taking the derivative of both the original signal and the reflected signal before doing the correlation. This operation essentially high pass filters the signal to provide a signal which is easier to process. Pulse shapes of higher order may also be utilized. For example, embodiments may make the STDR chips triangular rather than square and make the correlation waveform a second (or third) order curve rather than a first order (triangle). Additionally, the PN code may be modulated at a higher frequency. This provides the system with a narrower S/SSTDR pulse-shaped signature, which makes algorithms for determining the impulse response more accurate.

Utilizing Circuit Markers and Chokes

In some instances a circuit may be difficult or complex to analyze, and it would be beneficial to have a quick way to physically mark where in the physical circuit a reflection should be seen. For example, if the velocity of propagation of a wire is not known or has a great deal of ambiguity or variability, it may be difficult to determine exactly how far down the wire (in meters) the impedance changes causing reflections is occurring. Alternatively, a network of wires may be very complex and difficult to analyze. Moreover, it may not be known where within the physical space the wires are running, so it is difficult to know where a specific distance is within the physical device.

In some embodiments, a marker can be added to the system (such as system 100 or 200), temporarily or permanently, for the purpose of marking or indicating its location in the circuit, thus allowing other reflections to be diagnosed relative to this marker. If the marker is added to the circuit, and a new reflection peak is observed prior to a reflection peak of interest, it could be determined that the peak of interest is caused by an impedance change further down the wire than the marker. The marker could then be moved further down the wire, until the new peak is beyond the peak of interest, thus indicating that the marker is further down the wire than the impedance change causing the peak of interest.

An example of one such marker might be a given impedance (such as a resistor, capacitor, short circuit, etc.) that could be plugged into a household outlet when trying to diagnose a fault in that circuit. In some instances, embodiments may plug different impedances into multiple outlets, thereby marking each outlet individually within the network.

Another example of a marker would be a ferrite bead or RF choke clamped or placed around the wire under test. The ferrite could be chosen so that the test signal was blocked (choked) from passing through, thus placing the equivalent of a short circuit on the end of the wire. This could serve multiple purposes. For example, it would mark the location on the wire, and it would effectively remove the remaining portion of the system under test, thus reducing system complexity, or allowing the system to be tested in parts. The ferrite could also be chosen so that most of the test signal could pass through, but some of the signal would be impeded and reflected back to indicate the location of the marker. This would allow the remainder of the system to be tested, while still providing a marker for location.

In some embodiments, multiple markers or chokes may be placed within the test system. For example, if a fault is suspected in the middle of a large system, it might be advantageous to connect the test system into that region, and block both (or all) ends so that the rest of the system is not visible to the tester.

Another use of a marker may be configured to eliminate the reflection from a specific part of the circuit. In this case the marker would be impedance matched to the transmission line at that point. For instance, in the case of testing wires in a house, the reflection from one or several outlets could be removed by plugging in a matching resistor in those outlets. If the wire had a characteristic impedance of 300 ohms, for instance, the matching resistor should also be 300 ohms. A potentiometer could be plugged into the outlet, and adjusted until the reflection from that outlet was observed to go to zero or near zero. It should be noted that these markers may be static or dynamic.

Detecting Faults in Windings in Transformers/Motors

In one embodiment, a circuit to be tested (e.g. circuit 120), may comprise one or more transformers or windings. In such an example embodiment, S/SSTDR circuitry 110 may be configured to monitor insulation degradation or breakdown in a live motor or transformer winding. Additionally, in some embodiments, S/SSTDR circuitry may be configured to determine the fault location and provide meaningful data for preventive maintenance. When a winding is degrading or experiencing a fault, one or more properties of reflected signals in an S/SSTDR system may alter. This alteration may signify a change in impedance has occurred or may reflect that a fault (such as a short or open circuit) has been formed.

Figure 7A:
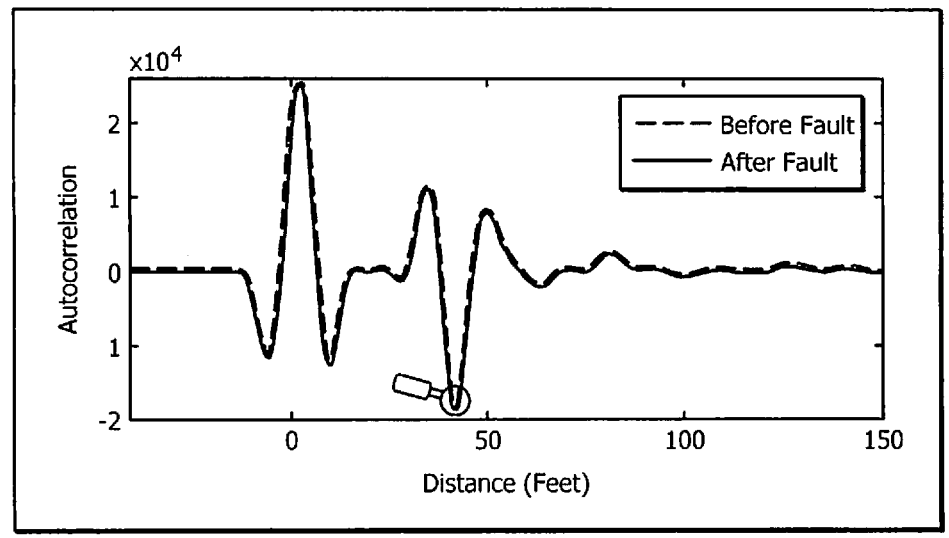
FIG. 7(a) illustrates a winding having one or more faults and autocorrelation plots before and after faults are introduced.
Figure 7B:
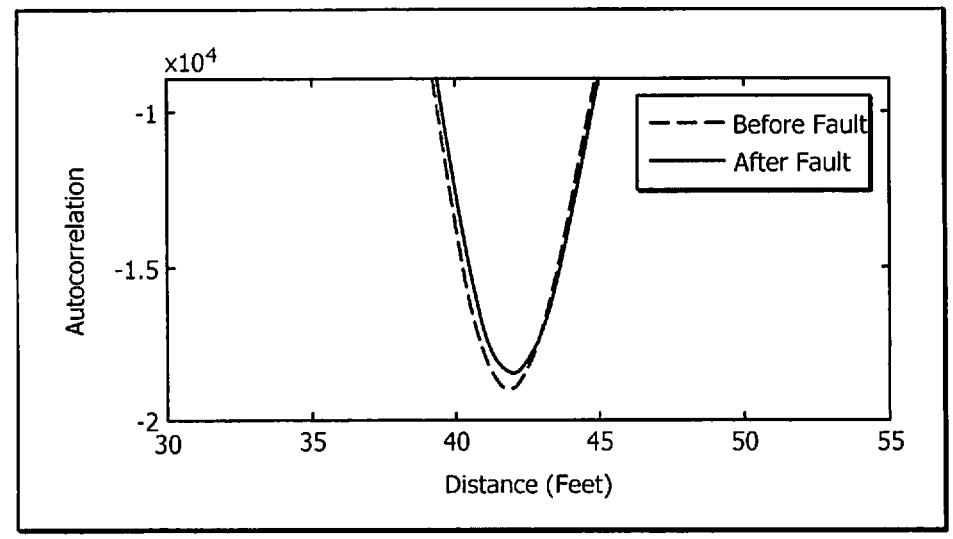
FIG. 7(b) illustrates an autocorrelation plots of winding 701 which illustrate signal correlations before and after faults are introduced.
Figure 7C:
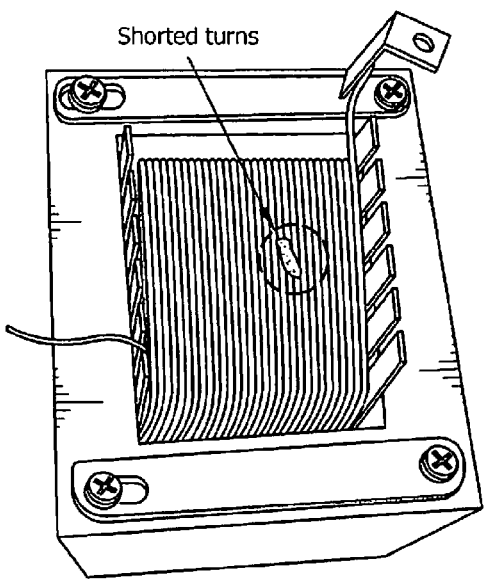
FIG. 7(c) illustrates an autocorrelation plots of winding 701 which illustrate signal correlations before and after faults are introduced.

In some embodiments, detection of winding failures may be done on a diagnostic basis while in other embodiments, such a detection may be implemented on a prognostic basis in order to predict degradation and/or failure of the component. FIG. 7a illustrates a winding 701 having one or more faults and FIG. 7 b-c illustrate autocorrelation plots of winding 701 which illustrate signal correlations before and after faults are introduced. In this example, a few turns of winding 701 have been shorted to illustrate the effects in S/SSTDR results. As can be seen, after the faults are introduced, the autocorrelation reduces. Such information may be utilized to diagnose a problem or to predict a future problem with winding 701.

Detecting Ground Faults and Arc Faults

Figure 8:
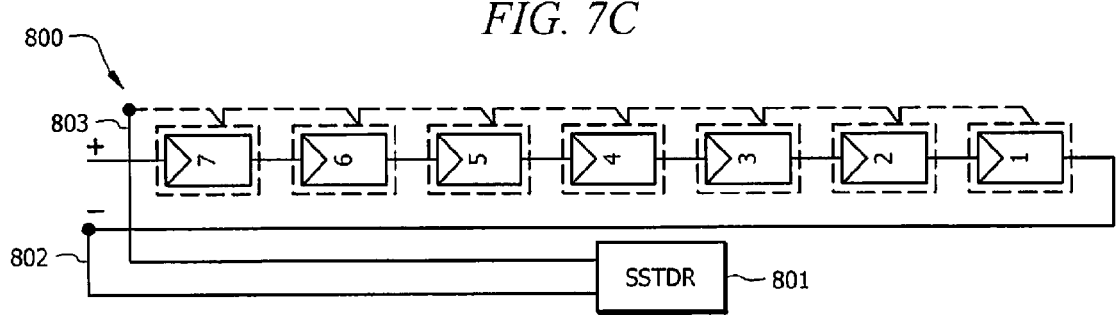
FIG. 8 illustrates a system for detecting ground faults and/or arc faults in accordance with an embodiment of the present application.
Figure 9:
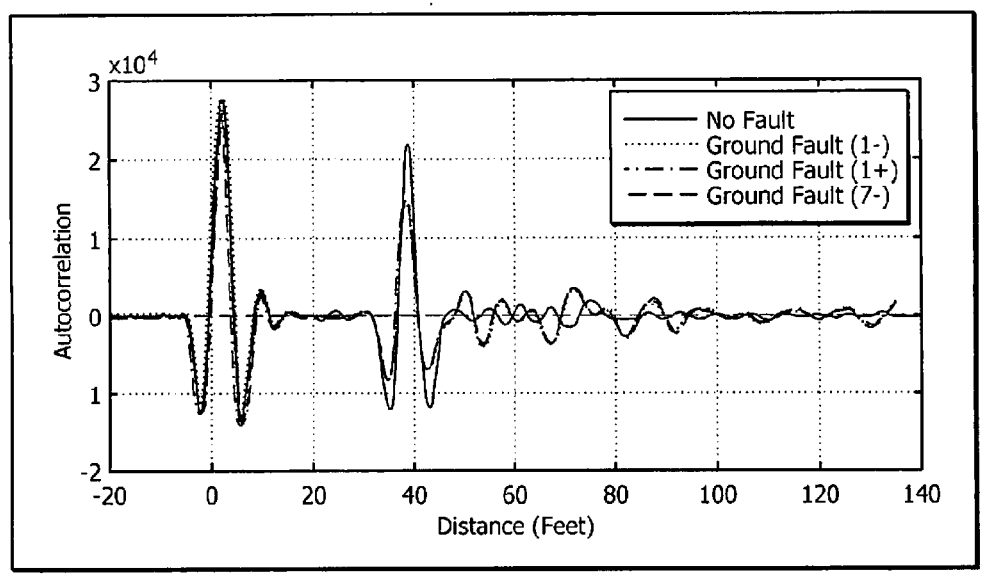
FIG. 9 illustrates ground fault measurement results vs. a healthy circuit.

FIG. 8 illustrates a system 800 for detecting ground faults and/or arc faults in accordance with an embodiment of the present application. A ground fault can be detected most effectively if S/SSTDR system 801 connects test points are across the negative 802 and ground terminals 803 of the PV system. To test a functional embodiment, data was collected for a healthy/no-fault PV string having seven series connected PV panels. Artificial ground faults were created in three different locations in the PV string and ground fault measurement results vs. a healthy circuit are illustrated in FIG. 9.

Figure 10:
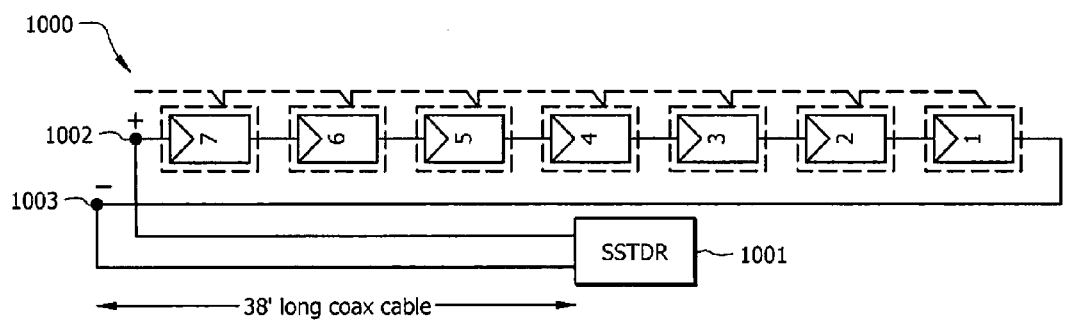
FIG. 10 illustrates a system for detecting open faults and/or arc faults in accordance with an embodiment of the present application.
Figure 11:
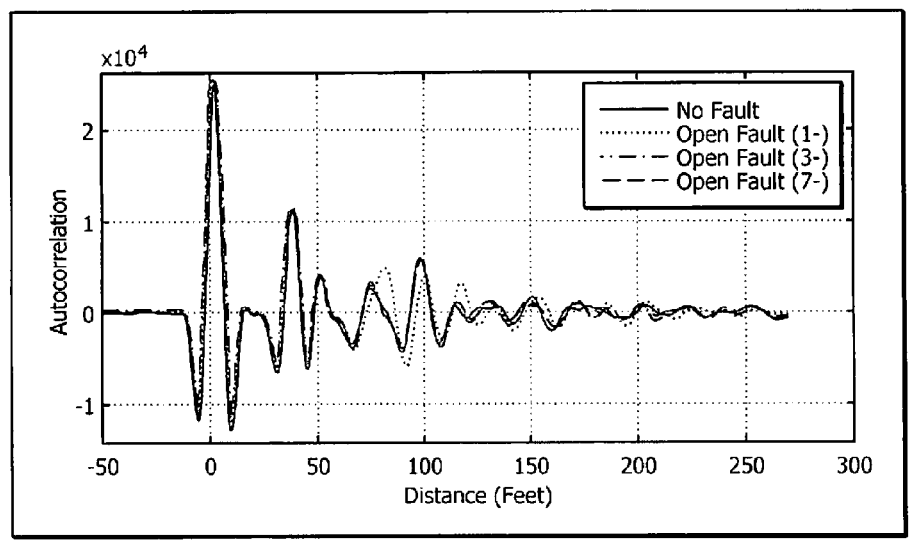
FIG. 11 illustrates open fault measurement results vs. a healthy circuit.

FIG. 10 illustrates a system 1000 for detecting open faults and/or arc faults in accordance with an embodiment of the present application. An open fault can be most effectively detected if S/SSTDR system 1001 connects test probes across the positive 1002 and negative 1003 terminals of the PV string. To test a functional embodiment, data was collected for a healthy/no-fault PV string having seven series connected PV panels. Then artificial open faults were created in three different locations of the PV string. Open fault measurement results vs. a healthy circuit are illustrated in FIG. 11.

As can be seen, ground faults and arc faults are measurable in a circuit utilizing S/SSTDR measurement techniques. The autocorrelated results provide information regarding that one or more faults exist, and the results illustrate differences in the response from faults located at different lengths along a line (which may be used to calculate the location of a fault.

In view of exemplary systems shown and described herein, methodologies that may be implemented in accordance with the disclosed subject matter, will be better appreciated with reference to various functional block diagrams. While, for purposes of simplicity of explanation, methodologies are shown and described as a series of acts/blocks, it is to be understood and appreciated that the claimed subject matter is not limited by the number or order of blocks, as some blocks may occur in different orders and/or at substantially the same time with other blocks from what is depicted and described herein. Moreover, not all illustrated blocks may be required to implement methodologies described herein. It is to be appreciated that functionality associated with blocks may be implemented by software, hardware, a combination thereof or any other suitable means (e.g., device, system, process, or component). Additionally, it should be further appreciated that methodologies disclosed throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

Figure 12:
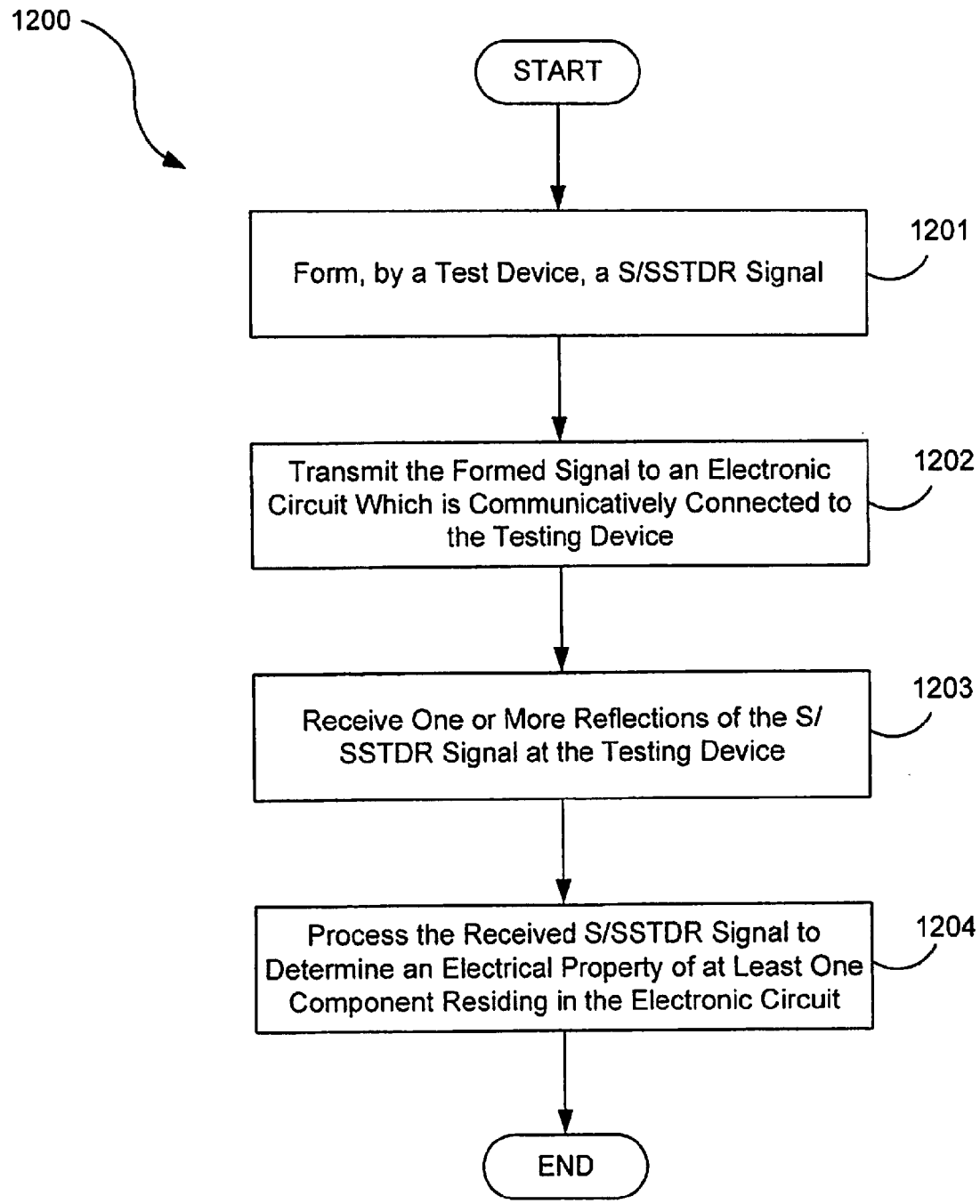
FIG. 12 illustrates a flowchart of a method in accordance with an embodiment of the present application.

FIG. 12 illustrates an example method 1200 for testing a device in its operating environment. It is noted that method 1200 may be implemented within one or more systems having sufficient processing capabilities, such as system 100 described above. Method 1200 may include, at 1201, forming, by a testing device, a S/SSTDR signal. Method 1200 may further include, at 1202, transmitting the formed signal to an electronic circuit which is communicatively connected to the testing device. Additionally, method 1200 may include, at 1203 receiving one or more reflections of the S/SSTDR signal at the testing device, and, at 1204, processing the received S/SSTDR signal to determine an electrical property of at least one component residing in the electronic circuit, wherein the electrical property is at least one of resistance, inductance and capacitance.

Figure 13:
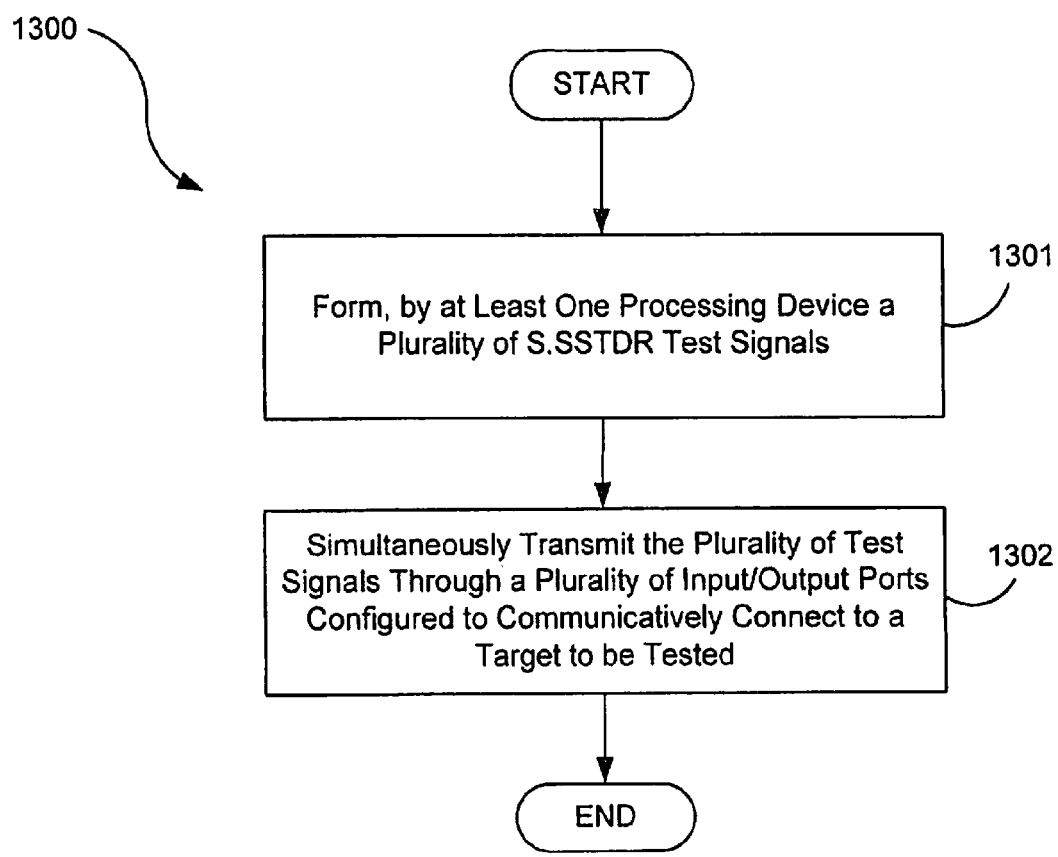
FIG. 13 illustrates a flowchart of a method in accordance with an embodiment of the present application.

FIG. 13 illustrates an example method 1300 for testing a device in its operating environment. It is noted that method 1300 may be implemented within one or more systems having sufficient processing capabilities, such as system 100 described above. Method 1300 may include, at 1301, forming, by at least one processing device a plurality of S/SSTDR test signals, and at 1302, simultaneously transmitting the plurality of test signals through a plurality of input/output ports configured to communicatively connect to a target to be tested. Such methods may test a circuit or system from with multiple ports simultaneously, e.g. send/receive the test signals simultaneously without undue interference between the transmitted and reflected signals.

Although embodiments of the present application and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the above disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method comprising:
   transmitting plural spread spectrum time domain reflectometry (S/SSTDR) signals onto a signal path of an electronic circuit;
   receiving plural reflections of the S/SSTDR signals from a known impedance within the electronic circuit;
   receiving plural reflections of the S/SSTDR signals from an unknown component of the electronic circuit; and
   processing the reflected signals from the known impedance and the reflections from the unknown component to determine an electrical property of an element of the electronic circuit.

2. The method of claim 1 wherein the unknown component is the element of the electronic circuit.

3. The method of claim 1 further comprising determining a state of a sensor residing in the electronic circuit based on the determined electrical property.

4. The method of claim 1 further comprising transmitting the S/SSTDR signals to plural signal paths of the electronic circuit simultaneously.

5. The method of claim 4 wherein the S/SSTDR signals are configured to be non-interfering with each other and with existing signals within the electronic circuit.

6. The method of claim 1 wherein a plurality of components in the electrical circuit are grouped into functional blocks and one of the functional blocks is the element of the electronic circuit.

7. The method of claim 1 further comprising processing the reflected signals to determine the location of the element of the electronic circuit.

8. The method of claim 1 further comprising processing the reflected signals to determine velocity of propagation of a transmission line in the electrical circuit.

9. An apparatus comprising:
   at least one processing device configured to:
      transmit plural spread spectrum time domain reflectometry (S/SSTDR) signals onto a signal path of an electronic circuit;
      receive plural reflections of the S/SSTDR signals from a known impedance within the electronic circuit;
      receive plural reflections of the S/SSTDR signals from an unknown component of the electronic circuit; and
      process the reflected signals from the known impedance and the reflected signals from the unknown component to determine an electrical property of an element of the electronic circuit.

10. The method of claim 9 wherein the unknown component is the element of the electronic circuit.

11. The apparatus of claim 9 wherein a plurality of components in the electrical circuit are grouped into functional blocks and one of the functional blocks is the element of the electronic circuit.

12. The apparatus of claim 9 wherein the at least one processing device is configured to transmit to plural signal paths of the electronic circuit simultaneously.

13. The apparatus of claim 12 wherein the S/SSTDR signals are configured to be non-interfering with each other and with existing signals within the electronic circuit.

14. The apparatus of claim 9 wherein the at least one processing device is further configured to detect at least one of an arc fault and ground fault.

15. The apparatus of claim 9 wherein the at least one processing device is further configured to process the reflected signals to determine the location of the element of the electronic circuit.

16. The apparatus of claim 9 wherein the at least one processing device is further configured to process the reflected signals to determine velocity of propagation of a transmission line.

17. An apparatus comprising:
   at least one processing device configured to form S/SSTDR test signals; and
   plural input/output ports configured to communicatively connect to a target to be tested;
   wherein the at least one processing device is configured to simultaneously:
      transmit plural spread spectrum time domain reflectometry (S/SSTDR) signals onto plural signal paths of an electronic circuit;
      receive plural reflections of the S/SSTDR signals from a known impedance within the electronic circuit;
      receive plural reflections of the S/SSTDR signals from an unknown component of the electronic circuit; and
      process the reflected signals from the known impedance and the reflected signals from the unknown component to determine an electrical property of an element of the electronic circuit.

18. The apparatus of claim 17 wherein the at least one processing device is further configured to analyze the reflected signals to determine the state of a winding component of a circuit.

19. The apparatus of claim 17 wherein the at least one processing device is further configured to analyze the reflected signals to determine if at least one of a ground fault and arc fault is present.

20. The apparatus of claim 17 wherein the at least one processing device is further configured to analyze the reflected signals to determine at least one of a resistance, capacitance, inductance, impedance, location and velocity of propagation.

* * * * *

UNITED STATES PATENT AND TRADEMARK OFFICE
CERTIFICATE OF CORRECTION

| | | |
|---|---|---|
| PATENT NO. | : 9,476,932 B2 | Page 1 of 1 |
| APPLICATION NO. | : 15/002704 | |
| DATED | : October 25, 2016 | |
| INVENTOR(S) | : Cynthia Furse et al. | |

It is certified that error appears in the above-identified patent and that said Letters Patent is hereby corrected as shown below:

On the Title Page

In item (73) Assignee, delete "University of Utah Foundation" and insert --University of Utah Research Foundation--.

Signed and Sealed this
Third Day of January, 2017

Michelle K. Lee
*Director of the United States Patent and Trademark Office*